United States Patent [19]

Jones

[11] 4,382,975
[45] May 10, 1983

[54] METHOD FOR COATING THIN FILM ALLOY ON A SUBSTRATE UTILIZING INDUCTIVE HEATING

[75] Inventor: Addison B. Jones, Yorba Linda, Calif.

[73] Assignee: Rockwell International Corporation, El Segundo, Calif.

[21] Appl. No.: 283,581

[22] Filed: Jul. 15, 1981

Related U.S. Application Data

[62] Division of Ser. No. 220,398, Dec. 29, 1980.

[51] Int. Cl.³ .............................................. C23C 13/02
[52] U.S. Cl. ........................................ 427/8; 427/45.1
[58] Field of Search .................................... 427/45.1, 8

[56] References Cited

U.S. PATENT DOCUMENTS 2,584,660  2/1952  Bancroft ............................ 427/45.1

Primary Examiner—James R. Hoffman
Attorney, Agent, or Firm—H. Fredrick Hamann; Wilfred G. Caldwell

[57] ABSTRACT

The invention is a thin film alloy source utilizing a supply of alloy wire selected for deposition onto a substrate. The wire is advanced through an induction heating means at a controlled rate for evaporation onto the substrate. Detection of the meniscus height or temperature of the end of the wire being evpaorated yields a control signal for operating the control wire feed mechanism for advancing the wire at a rate to provide a predetermined coating thickness.

4 Claims, 1 Drawing Figure

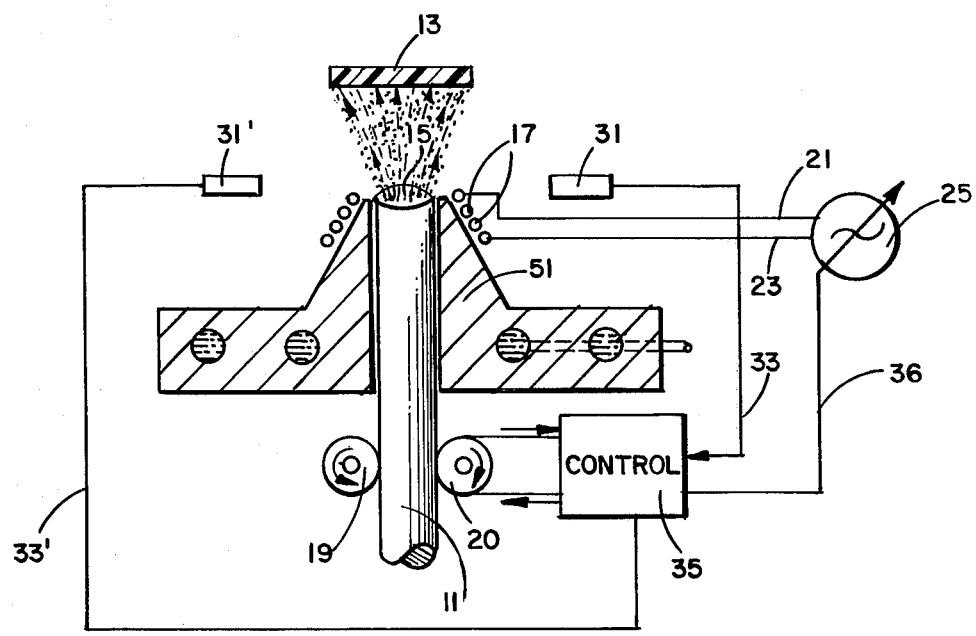

METHOD FOR COATING THIN FILM ALLOY ON A SUBSTRATE UTILIZING INDUCTIVE HEATING

This application is a division of application Ser. No. 220,398, filed Dec. 29, 1980.

FIELD OF THE INVENTION

The invention is an apparatus and method for thin film alloy deposition onto a substrate utilizing a source of alloy wire.

BACKGROUND OF THE INVENTION

Known prior art methods of deposition comprise utilizing the thrusting of an alloy wire against a heated plate to flash evaporate the wire onto the substrate, but this process is limited to a very few materials and then the chemical composition of the deposition changes with the source and plate utilization. Also, some prior art systems, especially those which heat by electron impact, may generate radiation which can damage the wafers being coated. More conventional techniques employing constituents of the alloy frequently have different vapor pressures at the evaporation temperature. Thus, the deposited film has different compositions than the source itself and thus, the deposited film will change as the deposition proceeds. The purpose of the invention is to avoid all of these prior art objections.

SUMMARY OF THE INVENTION

The invention comprises an arrangement and method for depositing selected film alloy on a substrate wherein a source of alloy wire is advanced through an induction heater to vaporize an end of the wire onto the substrate. Controlled advancing determines the thickness of deposit.

BRIEF DESCRIPTION OF THE DRAWING

The preferred invention is illustrated in the single FIGURE wherein a schematic drawing depicts the apparatus and method for evaporating an alloy wire via induction means onto a substrate for thin film deposition.

DESCRIPTION OF THE PREFERRED EMBODIMENT

A wire 11, of selected alloy for deposition onto substrate 13, has a tip end 15 advanced through induction heater coil 17 by virtue of rollers 19 and 20. The induction heater coil 17 is connected over leads 21 and 23 to a high frequency power source 25. Also, it will be noted that the induction heater coil 17 is conical in shape with its lesser diameter adjacent the tip 15 of wire 11 in order that the heating will be concentrated where the alloy material of wire 11 is to be evaporated onto substrate 13.

In order to control the depth of deposit, the tip end 15 of wire 11 is monitored and detected by detector 31 and control signals are fed over wire 33 to feed mechanism control 35 for controlling the speed of roller 20. A line-of-sight detector source to detect meniscus height at end of the wire would employ a source 31' in addition to detector 31. Control of the RF power via 36 to match the wire feed rate is indicated.

Many types of monitoring detectors may be employed. It is possible optically to monitor meniscus height of tip 15 to determine the speed of advancing for some control of the rate of deposition. Also, it is possible to monitor the temperature such as by using a pyrometer detector 31, for a similar type of control. Deposition rate monitoring may be achieved by micro balance or quartz crystal oscillator, and the power to coil 17 accordingly controlled or the speed regulated thereby. Those types of controls may be mixed to obtain otpimum deposition.

Also, it is optional and desirable to employ water cooled sleeve 51 surrounding the end of wire 11 adjacent tip 15 for concentrating the heat in the tip end 15 where the evaporation is to take place, by protecting the remainder of the wire exposed to the vicinity of heating. Tip 15 may act as a susceptor for the R.F. power. The tapering of the water cooled sleeve 51, relative to the wire 11 and the coil 17, causes the heat progressively to rise to provide an upward gradient toward tip 15 where the evaporation is taking place.

While a reading of the description of this invention will likely suggest alternatives to those skilled in the art, nevertheless it is the principles of the invention which are intended to be protected by the appended claims wherein what is claimed is:

1. The method of thin film alloy deposition on a substrate, comprising the steps of:
    selecting a wire of the alloy to be deposited;
    advancing an end of said wire through an induction heater in the vicinity of the substrate to evaporate the wire alloy for deposition onto the substrate;
    detecting and monitoring said end of said wire to produce a signal indicative of the amount of wire being evaporated for deposition;
    using said signal to control said advancing to determine the amount of deposition; and
    concentrating the induced heat in said end by inducing greater heat at the tip end than in the wire adjacent thereto.
2. The method of claim 1, wherein the step of detecting and monitoring comprises:
    detecting and monitoring the meniscus height of said end.
3. The method of claim 1, wherein the step of detecting and monitoring comprises:
    monitoring the temperature of said end.
4. The method of claim 1, including:
    disposing the substrate above said end of the wire; and,
    gradient cooling the advancing end of the wire to cause heat progressively to rise to provide an upward heat gradient toward the tip where evaporation is taking place.

* * * * *